(12) United States Patent
Bai

(10) Patent No.: US 9,667,205 B2
(45) Date of Patent: May 30, 2017

(54) MULTIMODE POWER AMPLIFIER AND METHOD OF SWITCHING AMONG MULTIPLE MODES THEREOF, AND MOBILE TERMINAL

(71) Applicant: VANCHIP (TIANJIN) TECHNOLOGY CO., LTD, Tianjin (CN)

(72) Inventor: Yunfang Bai, Tianjin (CN)

(73) Assignee: VANCHIP (TIANJIN) TECHNOLOGY CO., LTD, Tianjin (CN)

( * ) Notice: Subject to any disclaimer, the term of this patent is extended or adjusted under 35 U.S.C. 154(b) by 0 days.

(21) Appl. No.: 14/422,383

(22) PCT Filed: Jul. 2, 2013

(86) PCT No.: PCT/CN2013/078707
§ 371 (c)(1),
(2) Date: Feb. 19, 2015

(87) PCT Pub. No.: WO2014/029240
PCT Pub. Date: Feb. 27, 2014

(65) Prior Publication Data
US 2015/0236659 A1 Aug. 20, 2015

(30) Foreign Application Priority Data

Aug. 21, 2012 (CN) .......................... 2012 1 0298572

(51) Int. Cl.
*H03F 3/68* (2006.01)
*H03F 3/21* (2006.01)
*H03F 3/19* (2006.01)

(52) U.S. Cl.
CPC ............... *H03F 3/211* (2013.01); *H03F 3/19* (2013.01); *H03F 2200/451* (2013.01);
(Continued)

(58) Field of Classification Search
CPC ....................................................... H03F 3/211
(Continued)

(56) References Cited

U.S. PATENT DOCUMENTS 6,970,040 B1 * 11/2005 Dening ................. H03F 1/0277
330/124 R

FOREIGN PATENT DOCUMENTS

| CN | 101656514 | 2/2010 |
|---|---|---|
| CN | 102427339 | 4/2012 |
| WO | 2012085768 | 6/2012 |

* cited by examiner

*Primary Examiner* — Khanh V Nguyen
*Assistant Examiner* — Khiem Nguyen
(74) *Attorney, Agent, or Firm* — JMB Davis Ben-David

(57) ABSTRACT

Disclosed are a multimode power amplifier, also a method for implementing different work mode switching by the multimode power amplifier and a mobile terminal using the multimode power amplifier. The multimode power amplifier includes at least two stage amplification circuits, each stage amplification circuit is connected in serial way; each stage amplification circuit has at least one basic amplification unit array, the amplification unit array is composed of multiple basic amplification units in parallel way. Bias voltage of each basic amplification unit array is controlled independently. By configuring the bias voltage flexibly, the multimode power amplifier can implement the switching between saturation mode and linear mode, and meets the actual needs of multi-communication mode. In addition, the multimode power amplifier also has the advantages of lower cost, simple and flexible circuit, and easy realization.

5 Claims, 6 Drawing Sheets

(52) U.S. Cl.
CPC  *H03F 2200/54* (2013.01); *H03F 2203/21106* (2013.01); *H03F 2203/21127* (2013.01)

(58) Field of Classification Search
USPC ............. 330/302, 310, 311, 285, 295, 124 R
See application file for complete search history.

US 9,667,205 B2

MULTIMODE POWER AMPLIFIER AND METHOD OF SWITCHING AMONG MULTIPLE MODES THEREOF, AND MOBILE TERMINAL

CROSS-REFERENCE TO RELATED APPLICATIONS

This is the U.S. National Stage of International Application No. PCT/CN2013/078707, filed Jul. 2, 2013, which was published in Chinese under PCT Article 21(2), which in turn claims the benefit of China Patent Application No. 201210298572.3, filed Aug. 21, 2012.

BACKGROUND OF THE INVENTION

1. Field of the Invention

The present invention relates to a power amplifier (PA), and more specifically, to a multimode PA that accommodates both saturated and linear modes, and thus is capable of adapting to a plurality of telecommunication formats. The present invention also relates to a method of switching among different operating modes with the multimode PA and a mobile terminal that uses the multimode PA. The present invention, therefore, is in the field of PA technology.

2. Description of the Prior Art

With the third generation (3G) mobile telecommunication technology deployed on a largescale, 2G and 3G standards will coexist for a long period of time. Therefore, the resources telecommunication operators invested on 2G deployment would not be wasted while the operators are phasing-in 3G smoothly so to lower the cost. Currently, three 3G standards—TD-SCDMA, CDMA2000 and WCDMA 3-co-exist in the Chinese market. In addition, Wi-Fi and WiMax, as supplementary technology of 3G-LTE, also have significant potential. Thus, the market environment in which a plurality of telecommunication standards co-exists requires more adaptability from mobile terminals.

Multimode technologies comprise the multimode adaptability of base stations and mobile terminals. With mobile terminals, the multimode adaptability cannot be realized without a multimode power amplifier (PA). In general, there are two types of PAs: PAs operating in saturation mode or in linear mode. A saturated PA is needed in the Global System for Mobile Communication (GSM) system. It adopts GMSK modulation and is capable of compressing the amplitude of its radio frequency (RF) signals as the signals do not contain modulation information. In a CDMA-based 3G system, such as EDGE, TD-SCDMA, TD-LTE or CDMA2000, a linear PA is required.

One feature of a PA in saturation mode is that within a certain range of input power, the output power is not determined by the input power but by the power supply of the PA's output stage and the load impedance. With a PA in linear mode, the output power is always proportional to the input power. Even with telecommunication standards that require a linear PA, such as EDGE, TD-SCDMA, TD-LTE, or WCDMA, the requirements on the PA's output power, gain and current may differ as the internet standard may be different. This analysis shows that a saturation PA and a linear PA requires completely different design, and the transistor parameters and operating current that meet the requirement of their respective circuits are very different.

In order to meet the requirements imposed by different telecommunication standards to a PA, the current technology usually apply several single mode PAs coupled with a gating switch. However, the method significantly increases the cost. For example, a Chinese patent application number 201110346135.X, disclosed a power amplifying module, a multimode RF transceiver, a RF front-end module, a multimode terminal module and a method of sending signals from a multimode terminal. The patent comprises two operating modes, the first is GSM-mode signals and the second is TD-SCDMA-mode signals. When the controlling signal is a low-frequency signal in the first mode, the controller sends a signal of saturation mode to the low-frequency amplifier. When the controlling signal is a high-frequency signal in the first mode, the controller sends a signal of saturation mode to the high-frequency amplifier. When the controlling signal is in the second mode, the controller sends a signal of linear mode to the high-frequency amplifier.

A Korean patent application number KR 10-2010-0051808, discloses a device and method that assembles power amplifying units in one module to support multimode mobile terminals, so to reduce the space and cost of multimode mobile terminals. The PA of mobile terminals comprises a first amplifying unit and a second amplifying unit. The first amplifying unit defines the four bands of GSM as low-frequency bands and high-frequency bands, and then amplifies signals of the low-frequency bands. The second amplifying unit amplifies signals of the high-frequency bands and TD-SCDMA signals, with both signals selected by a TD-SCDMA controlling and switching unit.

In addition, a U.S. patent application Ser. No. 09/455,813, introduces a PA comprising a carrier amplifier and a peak amplifier for multimode mobile telecommunication devices. The peak amplifier has an adjustable bias voltage, so that a regulator can adjust the voltage to a predetermined level according to the selected telecommunication mode. The bias voltage of the peak amplifier maintains the same as long as the communication mode stays the same. The modulation efficiency and linearity of a specific telecommunication mode can be optimized by adjusting bias points of the peak amplifier that are relevant to the selected telecommunication mode.

SUMMARY OF THE INVENTION

A primary object of the present invention is to provide a multimode power amplifier (PA) which accommodates both saturated and linear modes, so to adapt to an environment in which multiple telecommunication modes co-exist.

Another object of the present invention is to provide a method by which the multimode power amplifier switches among different operating modes.

A third object of the present invention is to provide a mobile terminal that uses the multimode power amplifier.

In order to achieve these objects, the present invention provides the following technical solutions: a multimode PA, a method of switching among different modes, and a mobile terminal.

The multimode PA of the present invention comprises two or more stages of amplifier circuits connected in cascade. Amplifier circuits at each stage have one or more basic amplifying unit array. The amplifying unit array comprises a plurality of basic amplifying units connected in parallel.

Each basic amplifying unit comprises a capacitor, an amplifying transistor and a resistor. The capacitor connects, at one end, a radio frequency (RF) signal input terminal, and at another end, a base of the amplifying transistor. The resistor connects, at one end, a bias voltage terminal, and at another end, the base of the amplifying transistor. The collector of the amplifying transistor is connected to the supply voltage terminal.

Preferably, a supply voltage terminal of an amplifier circuit in the previous stage couples RF signals to the RF signal input terminal of an amplifier circuit in the next stage.

Preferably, an inductor is installed between the voltage source terminal of the amplifier circuit in the previous stage and the RF signal input terminal of the amplifier circuit in the next stage.

Preferably, the emitter of the amplifying transistor of each basic amplifying unit is connected to a reference voltage.

Preferably, the bias voltage of each basic amplifying unit array is controlled independently.

The present invention also provides a method of switching among different modes to put the multimode PA into practice. The method comprises the following steps:

Exercise independent control over the bias voltage of each basic amplifying unit array of each amplifier circuit of the multimode PA.

Adjust the bias voltage of each basic amplifying unit array, so that all amplifying transistors are turned on when the multimode PA maintains a saturation mode.

Adjust the bias voltage of each basic amplifying unit array so that some amplifying transistors are turned on when the multimode PA maintains a linear mode.

Preferably, turn on the predetermined basic amplifying units through configuring the bias voltage in different linear modes, and optimize performances in different linear modes through adjusting the bias voltage.

Preferably, if the multimode PA must cover different telecommunication standards or different power modes in a specific telecommunication standard, it can be achieved by adjusting the number of basic amplifying units that are on or off, and the bias voltage of the basic amplifying units that are turned on. Or, it can also be achieved by dividing the predetermined basic amplifying unit arrays into smaller basic amplifying unit arrays, and adjusting the bias voltage of each smaller basic amplifying unit arrays individually.

The present invention further provides a mobile terminal equipped with the multimode PA of the present invention.

The multimode PA of the present invention can configure flexibly the bias voltage and realize various combinations of saturated and linear modes, so to meet the actual requirements of a plurality of telecommunication standards, including EDGE, TD-SCDMA, TD-LTE and CDMA 2000. In addition, the multimode PA costs less, has simple and flexible circuits, and is easy to realize.

DETAILED DESCRIPTION OF THE PREFERRED EMBODIMENTS

A detailed explanation of the present invention supplemented by figures and implementation specifics are provided below.

A multimode power amplifier (PA), generally, comprises two basic types of PAs: PAs in saturation mode or in linear mode. A PA operating in linear mode usually needs to cover different telecommunication standards, such as EDGE, TD-SCDMA, SCDMA, TD-LTE, and so on. With a given telecommunication standard (e.g. WCDMA), a linear PA often needs to have different power (or gain) modes, such as high-power (high-gain) mode, median-power (median-gain) mode, and low-power (low-gain) mode.

To meet the needs, the multimode PA of the present invention comprises X (a positive integer) basic amplifying units connected in parallel or cascade. The basic amplifying units can be turned on or off, or configured for different power modes through a bias voltage, thus a gating switch is no longer needed. The basic amplifying units can be reused in different telecommunication mode. The optimum current and circuit performance are achieved through adjusting and optimizing the bias voltage in different telecommunication modes. A more detailed description is provided below.

Figure 1:
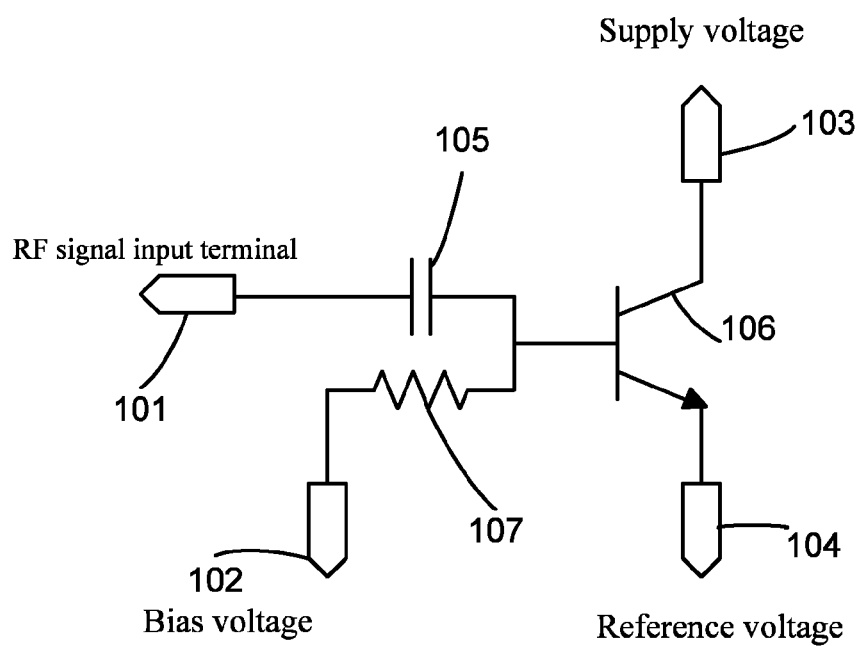
FIG. 1 is a circuit diagram showing one basic amplifying unit of the multimode PA.

FIG. 1 is a circuit diagram showing one basic amplifying unit of the multimode PA. The basic amplifying unit, used to realize the basic amplifying function of the multimode PA, comprises a capacitor 105, an amplifying transistor 106 and a resistor 107. The capacitor 105, at one end, connects to the RF signal input terminal so to receive an inputted RF signal 101; and at another end, connects to the base of the amplifying transistor 106, so to couple the RF signal 101 to the base of the amplifying transistor 106 through the capacitor 105. The resistor 107, at one end, connects to a bias voltage terminal so to receive a bias voltage 102, and at another end, connects to the base of the amplifying transistor 106 so that the bias voltage 102 can provide direct current to the amplifying transistor 106 through the resistor 107. A collector of the amplifying transistor 106 connects to a supply voltage terminal 103 so to couple the voltage source to the collector of the amplifying transistor 106 through an inductor. The emitter of the amplifying transistor 106 connects to the reference voltage 104. The adjustment of the bias voltage can be made by a complementary metal-oxide-semiconductor (CMOS) circuit. It is a regular design that can be delivered by any electronics technician, and requires no further explanation.

Figure 2:
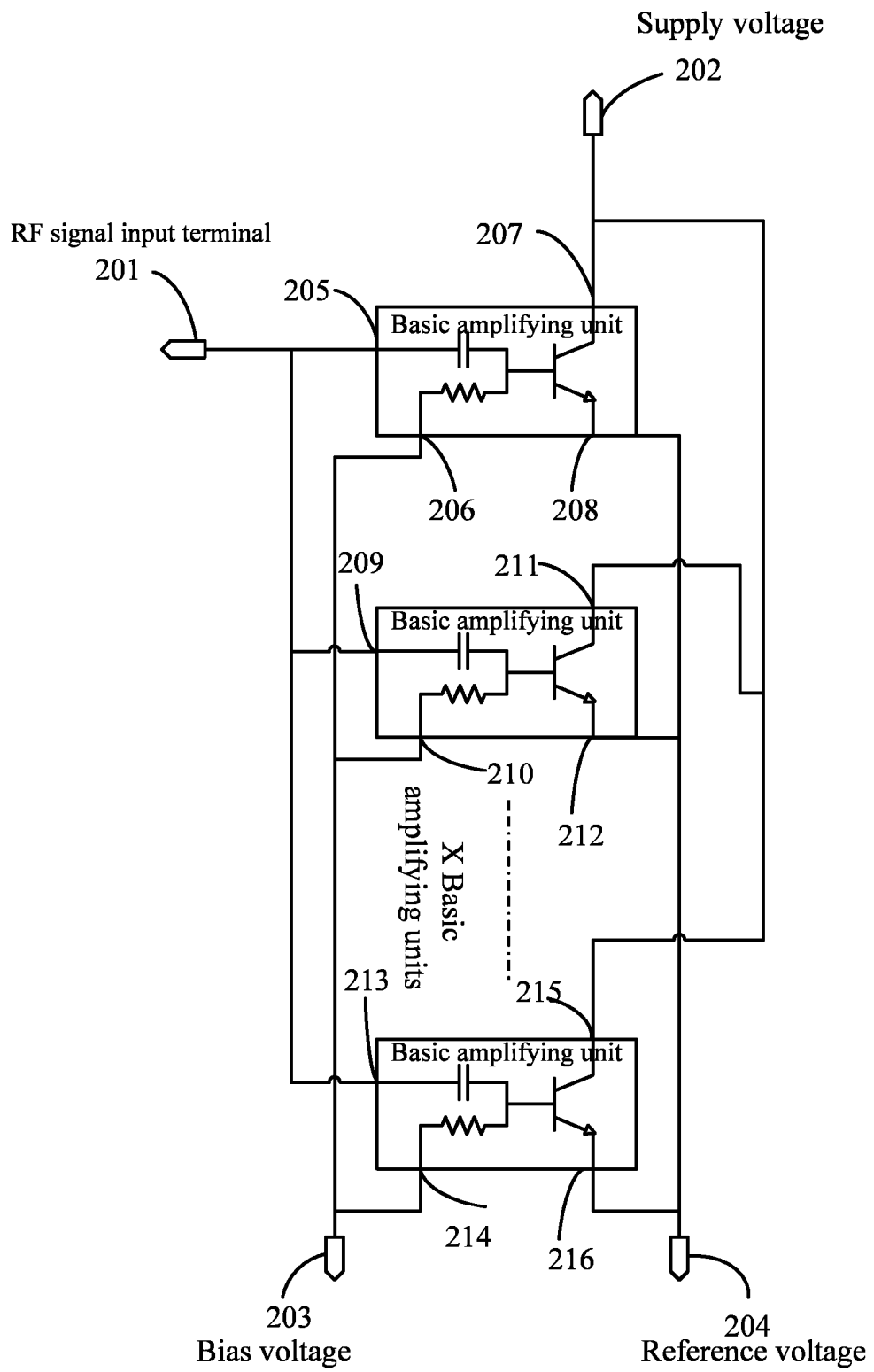
FIG. 2 is a diagram showing one basic amplifying unit array composed of a plurality of basic amplifying units connected in parallel.
Figure 3:
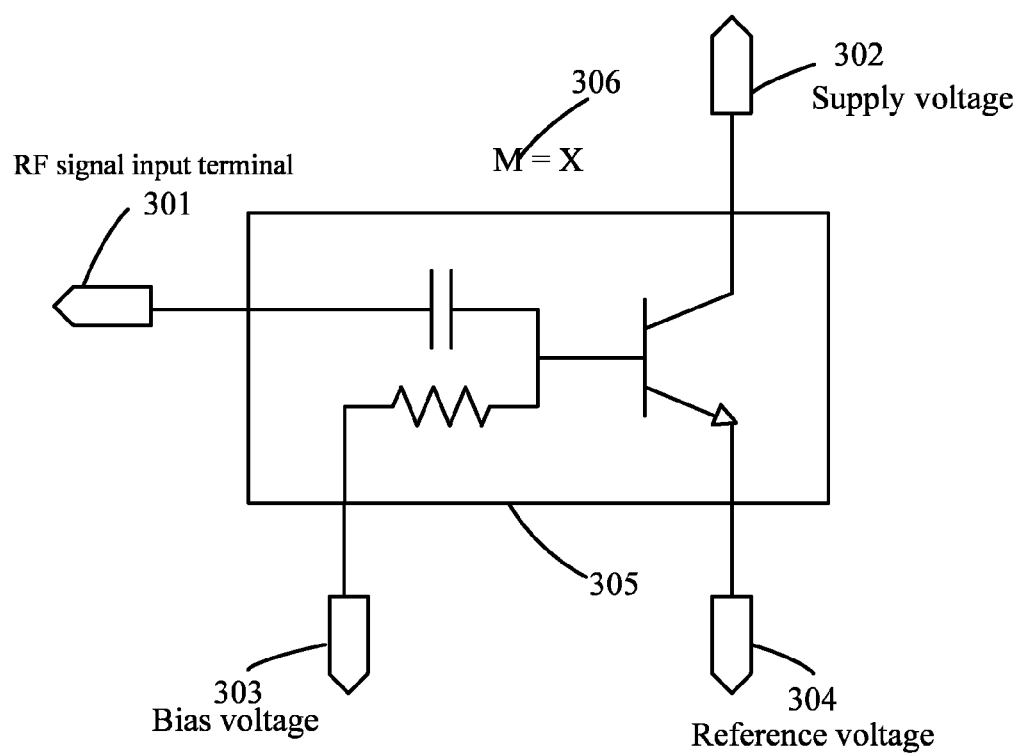
FIG. 3 is a simplified diagram of the basic amplifying unit array in FIG. 2.

FIG. 2 is a diagram showing one basic amplifying unit array composed of X basic amplifying units connected in parallel. FIG. 2 shows only three basic amplifying units and omits other units. A RF signal input terminal 201 connects to RF signal input terminals (such as 205, 209 and 213 in FIG. 2) of X basic amplifying units respectively. A bias voltage terminal 202 connects to bias voltage terminals (such as 206, 210 and 214 in FIG. 2) of X basic amplifying units respectively. A supply voltage terminal 203 connects to supply voltage terminals (such as 207, 211 and 215 in FIG. 2) of X basic amplifying units respectively. A reference voltage terminal 204 connects to reference voltage terminals (such as 208, 212 and 216 in FIG. 2) of X basic amplifying units respectively. FIG. 3 is a simplified diagram of the basic amplifying unit array in FIG. 2, and used in FIG. 4. FIG. 3 shows an equation, M=X, meaning that the basic amplifying unit array is composed of X basic amplifying units connected in parallel.

Figure 4:
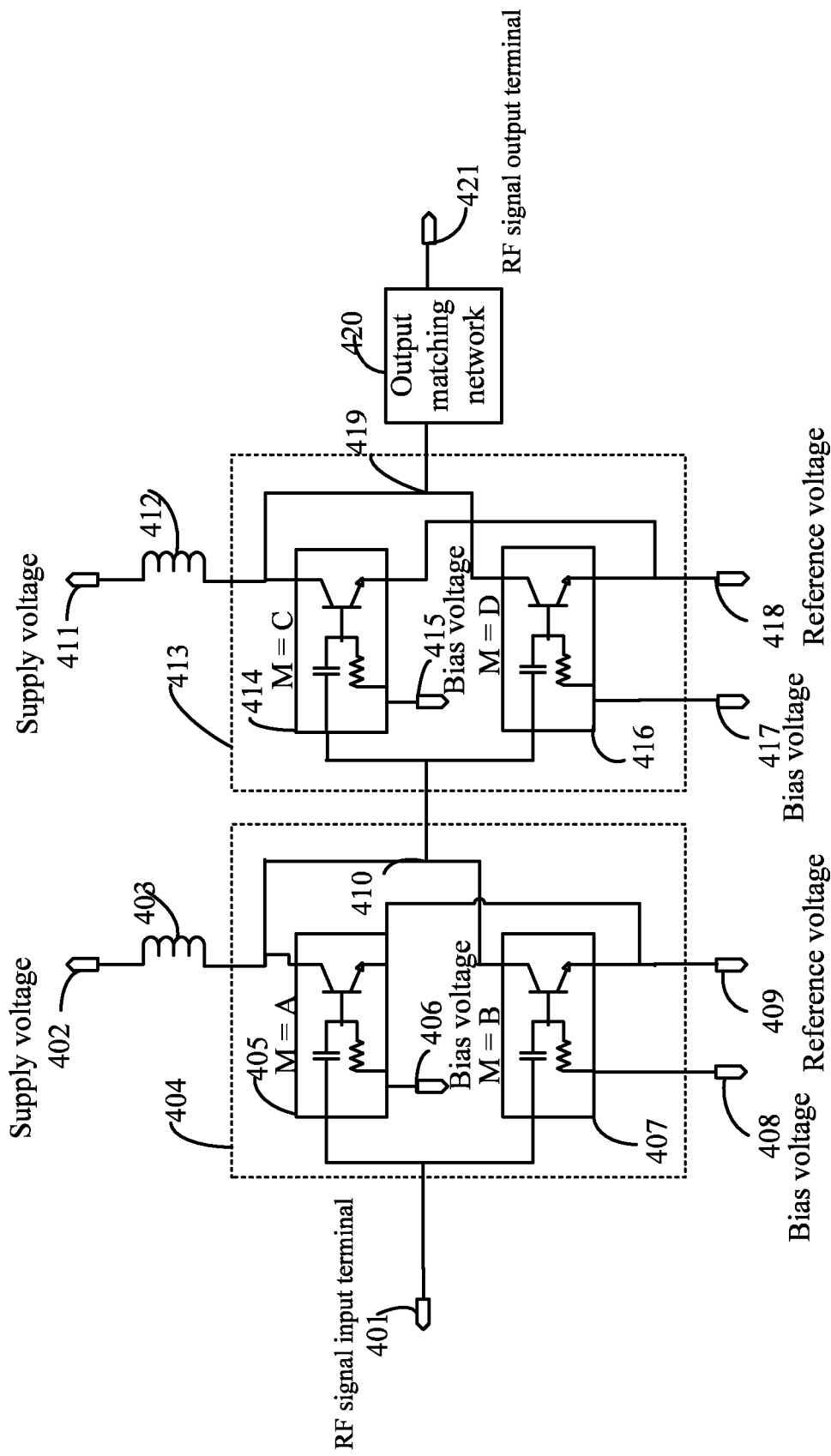
FIG. 4 shows a circuit diagram of a multimode PA with a two-stage amplifier circuit.

FIG. 4 shows a circuit diagram of a multimode PA with a two-stage amplifier circuit. The RF signal input terminal 401 connects to an amplifier circuit 404 at the first stage, which is connected to an amplifier circuit 413 at the second stage in cascade. The amplifier circuit 404 at the first stage is composed of a basic amplifying unit array 405 connecting a basic amplifying unit array 407 in parallel. The basic amplifying unit array 405 is composed of A (a positive integer) basic amplifying units connected in parallel, and the basic amplifying unit array 407 is composed of B (a positive integer) basic amplifying units connected in parallel. A bias voltage 406 provides direct current bias to the basic amplifying unit array 405. A bias voltage 408 provides direct current bias to the basic amplifying unit array 407. Correspondingly, a reference voltage 409 provides reference voltage to the basic amplifying unit array 404, and a reference voltage 418 provides reference voltage to the basic amplifying unit array 413. A supply voltage terminal 402 of the amplifier circuit 404 at the first stage couples RF signals to a RF signal input terminal 410 of the amplifier circuit 413 at the second stage through an inductor 403. The amplifier circuit 413 at the second stage comprises basic amplifying unit arrays 414 and 416 connected in parallel. The amplifying unit array 414 comprises C (a positive integer) basic amplifying units connected in parallel, and the basic amplifying unit array 416 comprises D (a positive integer) basic amplifying units connected in parallel. A bias voltage 415 provides direct current bias to the basic amplifying unit array 414, and a bias voltage 417 provides direct current bias to the basic amplifying unit array 416. The amplifier circuit 413 at the second stage connects to the supply voltage terminal 411 through an inductor 412, and couples RF signals to an output matching network 420 at a node 419, and completes outputting signals at a RF signal output terminal 421.

FIG. 4 shows that an obvious feature of the multimode PA is that predetermined basic amplifying units can be turned on or off through a flexible configuration of bias voltages. In other words, the PA enables some basic amplifying units operate (to amplify or in saturation mode) and cut-off, involving or not involving in the amplification. For example, a bipolar transistor is stopped if its emitter junction and collector junction are reverse-biased through adjusting the bias voltage. The transistor is amplifying if the emitter junction is forward-biased and the collector junction is reverse-biased through adjusting the bias voltage. The transistor is saturated if the emitter junction and collector junction are forward-biased through adjusting the bias voltage.

With field-effect transistors (FET), the relationship between the adjustment of bias voltage and operating modes is similar. Please refer to relevant product manuals for specific parameters.

Therefore, the basic amplifying units can be used in both the saturated and linear modes, and can realize a plurality of combinations of different saturated and linear modes in one multimode PA. When switching among different modes, the multimode PA does not need a gating switch or extra amplifier circuits. In addition, each amplifying unit can have different operating currents in different modes so to further optimize the amplifier's performance in different operating modes.

For example, when the multimode PA is in saturation mode, it has a larger regular power output. Thus the number of basic amplifying units operating regularly is the largest, so is the operating current of the circuit. If the multimode PA shown in FIG. 4 is operating in saturation mode, all basic amplifying unit arrays 405, 407, 414 and 416 would be turned on. Through adjusting and optimizing the numbers, A, B, C, D, of basic amplifying units of the basic amplifying unit arrays, and the level of the bias voltages 406, 408, 415 and 417, a designated performance requirement in the saturate mode can be achieved.

When the multimode power amplifier is in linear mode, the number of basic amplifying unit operating regularly is less than that in saturation mode, and the operating current is much lower than that in saturation mode. Therefore, some basic amplifying units can be turned off through controlling the bias voltages. For example, in FIG. 4, the basic amplifying units in the basic amplifying unit arrays 405 and 414 can be turned off through controlling the bias voltages 406 and 415; and the basic amplifying units in the basic amplifying unit arrays 407 and 416 can be turned on through controlling the bias voltages 408 and 417. Thus, corresponding technical requirements can be achieved through adjusting and optimizing the numbers, B and D, of the basic amplifying units in the basic amplifying unit arrays 407 and 416, and the bias voltages 408 and 417.

In the examples, the number A should be greater than or equal to zero, but less than A+B. The number C should be greater than or equal to zero, but less than C+D.

Furthermore, if there is a plurality of different linear modes, the predetermined basic amplifying units can still be turned on through configuring the bias voltages, and realize the optimum performance of different linear modes through adjusting and optimizing the bias voltages. For example, when the multimode PA is operating in linear mode, it must cover different telecommunication standards (e.g. EDGE, WCDMA, TD-SCDMA, or TD-LTE), or meet the requirements of different power (gain) modes in a specific telecommunication format. It can be achieved through dividing the basic amplifying unit arrays 407 and 416 (or other basic amplifying unit arrays) into smaller basic amplifying unit arrays, adjusting the bias voltages of the smaller basic amplifying unit arrays individually, and adjusting and optimizing the number of basic amplifying units that are on or off, or the bias voltages of the basic amplifying units that are turned on.

Figure 5:
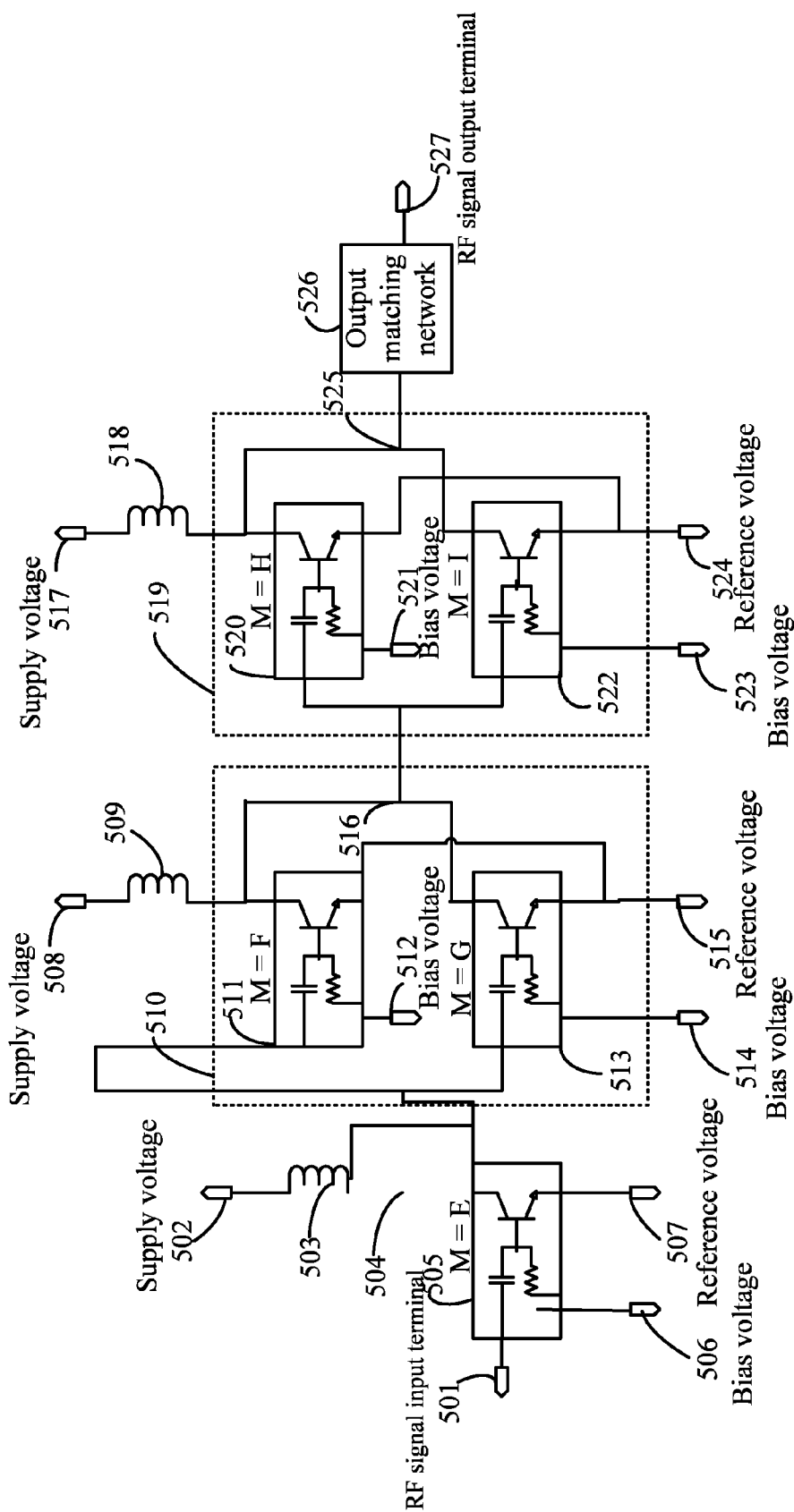
FIG. 5 shows a circuit diagram of a multimode PA with a three-stage amplifier circuit.

FIG. 5 shows a circuit diagram of a multimode PA with a three-stage amplifier circuit. The three-stage amplifier circuit comprises a first-stage amplifier circuit 505, a second-stage amplifier circuit 510, and a third-stage amplifier circuit 519, connected with each other in cascade. The first-stage amplifier circuit is a basic amplifying unit array 505, comprising E (a positive integer) basic amplifying units connected in parallel. A RF signal input terminal 501 connects to the basic amplifying unit array 505. A supply voltage terminal 502 couples RF signals to an RF signal input terminal 504 of an amplifier circuit 510 at the second stage through an inductor 503. A bias voltage 506 provides direct current bias to the basic amplifying unit array 505. A reference voltage 507 provides reference voltage to the basic amplifying unit array 505. The amplifier circuit 510 at the second stage comprises basic amplifying unit arrays 511 and 513 connected in parallel. The basic amplifying unit array 511 comprises F (a positive integer) basic amplifying units connected in parallel, and the basic amplifying unit array 513 comprises G (a positive integer) basic amplifying units connected in parallel. A bias voltage 512 provides direct current bias to the basic amplifying unit array 511, and a bias voltage 514 provides direct current bias to the basic amplifying unit array 513. A reference voltage 515 provides reference voltage to the basic amplifying unit arrays 511 and 513 respectively. A supply voltage terminal 508 of the amplifier circuit 510 at the second stage couples RF signals to the RF signal input terminal of an amplifying circuit 519 at the third stage through an inductor 509. The amplifying circuit 519 at the third stage comprises basic amplifying unit arrays 520 and 522 connected in parallel. The basic amplifying unit array 520 comprises H (a positive integer) basic amplifying units connected in parallel, and the basic amplifying unit array 522 comprises I (a positive integer) basic amplifying units connected in parallel. A bias voltage 521 provides direct current bias to the basic amplifying unit array 520, and a bias voltage 523 provides direct current bias to the basic amplifying unit array 522. A reference voltage 524 provides reference voltage to the basic amplifying unit arrays 520 and 522 respectively. At a node 525, the amplifier circuit 519 at the third stage connects to the supply voltage terminal 517 through an inductor 518, couples RF signals to an output matching network 526, and completes outputting signals at a RF signal output terminal 527.

When the multimode PA shown in FIG. 5 is operating in saturation mode, the basic amplifying units in the basic amplifying unit arrays 505, 511, 513, 520 and 522 are turned on. Therefore, a specific performance requirement can be achieved through adjusting and optimizing the numbers, E, F, G, H, I, of the basic amplifying units in each basic amplifying unit arrays, and the corresponding bias voltages 506, 512, 514, 521 and 523. In the saturation mode, all the basic amplifying units in the amplifier circuit 505 at the first stage, the amplifier circuit 510 at the second stage, and the amplifier circuit 519 at the third stage operate regularly. The bias voltages 506, 512, 514, 521 and 523 of the basic amplifying unit arrays 505, 511+513, and 520+522 can be determined based on the technical requirements of the amplifying transistors.

When the multimode PA of FIG. 5 is operating in linear mode, the basic amplifying units in the basic amplifying unit arrays 511 and 520 can be stopped through controlling the bias voltages 512 and 521. The basic amplifying units in the basic amplifying unit arrays 505, 513 and 522 can be turned on through controlling bias voltages 506, 514 and 523. Corresponding technical requirements can be achieved through adjusting and optimizing the numbers, G and I, of the basic amplifying units in the basic amplifying unit arrays 513 and 522, and the bias voltages 506, 514 and 523.

The number G is greater than or equal to zero, but less than F+G. The number I is greater than or equal to zero, but less than H+I.

If the multimode PA operating in linear mode must cover different telecommunication standards (e.g. EDGE, WCDMA, TD-SCDMA, or TD-LTE), or meet the requirements of different power (gain) modes in a specific telecommunication standard, it can divide the basic amplifying unit arrays 513 and 522 (or other basic amplifying unit arrays) into smaller basic amplifying unit arrays, adjust the bias voltages of the smaller basic amplifying unit arrays individually, and adjust and optimize the number of basic amplifying units that are on or off, or the bias voltages of the basic amplifying units that are turned on.

In most cases, the first-stage amplifier circuit is not changed because of the possible influence of the input impedance. But the performance can still be optimized through adjusting the bias voltage 506 accordingly. For example, if the bias voltages 512 and 521 are at a zero voltage level, then the basic amplifying unit array 511 in the amplifier circuit 510 at the second stage and the basic amplifying unit array 520 in the amplifier circuit 519 at the third stage can be turned off. In addition, parameter G of the basic amplifying unit array 513, parameter I of the basic amplifying unit array 522, and the level of the bias voltages 514 and 523 can be determined according to the specific performance requirements imposed by the linear mode.

Figure 6:
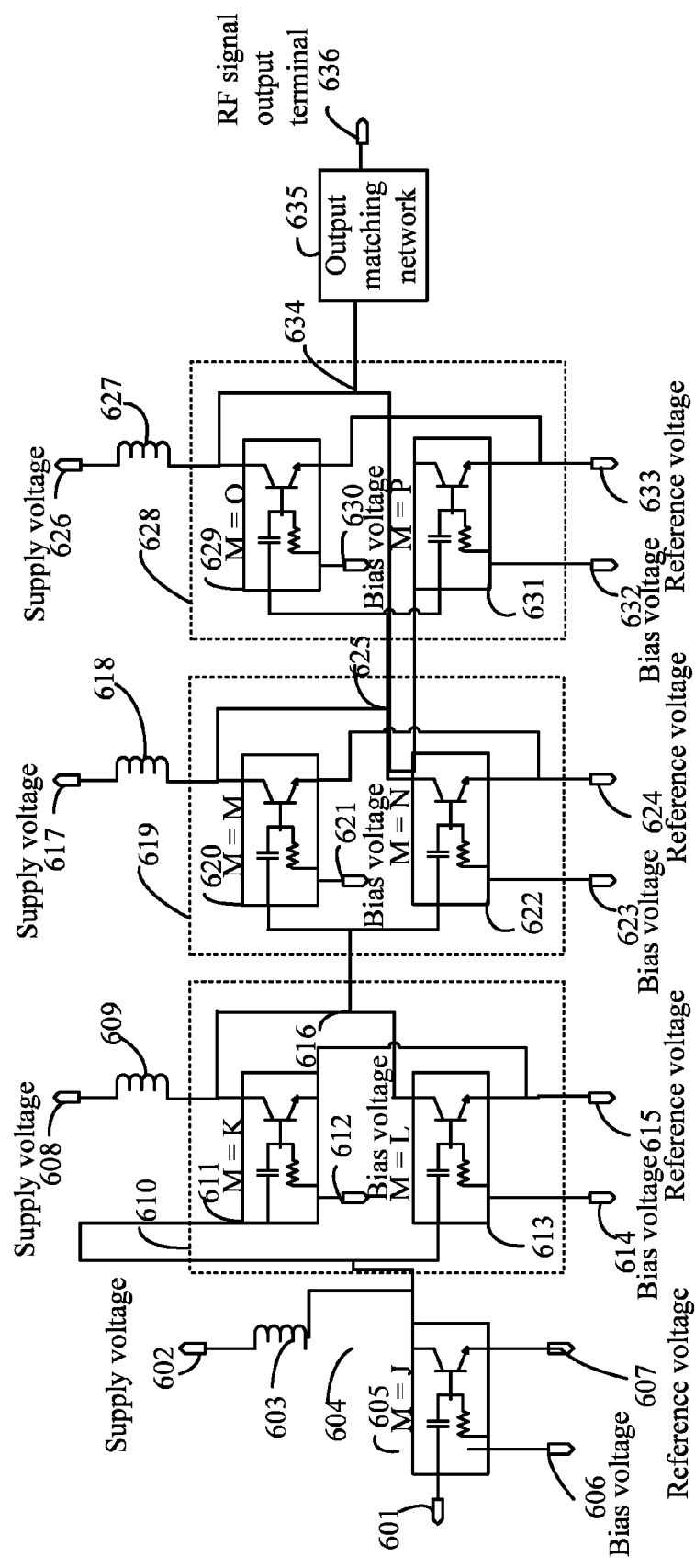
FIG. 6 shows a circuit diagram of a multimode PA with a four-stage amplifier circuit.

FIG. 6 shows a circuit diagram of a multimode PA with a four-stage amplifier circuit. The multimode PA has a first-stage amplifier circuit 605, a second-stage amplifier circuit 610 and a third-stage amplifier circuit 619, whose internal structure and operating principle is basically the same as that of the multimode PA shown in FIG. 5, thus no further explanation is provided here. The amplifier circuit 628 at the fourth stage, connecting to the amplifier circuit 619 at the third stage in cascade, has the same internal structure and operating principle as the circuit 619. When the multimode PA of FIG. 6 is operating in saturation mode, all the basic amplifying units in the basic amplifying unit arrays 605, 611, 613, 620, 622, 629, and 631 are turned on. Corresponding performance requirements can be achieved through adjusting and optimizing the numbers, J, K, L, M, N, O, P (all are positive integers), of basic amplifying units and the level of bias voltages 606, 612, 614, 621, 623, 630 and 632.

When the multimode PA of FIG. 6 is in linear mode, basic amplifying units in the basic amplifying unit arrays 611, 620 and 629 can be stopped through controlling the bias voltages 612, 621 and 630. The basic amplifying units in the basic amplifying unit arrays 605, 613, 622 and 631 can be turned on through controlling the bias voltages 606, 614, 623 and 632. Therefore, corresponding technical requirements can be achieved through adjusting and optimizing the numbers, L, N, P, of the basic amplifying units in the basic amplifying unit arrays 613, 622 and 631, and the bias voltages 606, 614, 623 and 632.

The number L is greater than or equal to zero, but less than F+L. The number N is greater than or equal to zero, but less than M+N. The number P is greater than or equal to zero, but less than O+P.

If the multimode PA operating in linear mode must cover different telecommunication standards (e.g. EDGE, WCDMA, TD-SCDMA, or TD-LTE), or meet the requirements of different power (gain) modes in a specific telecommunication standard, it can divide the basic amplifying unit arrays 613, 622 and 631 (or other basic amplifying unit arrays) into smaller basic amplifying unit arrays, adjust the bias voltages of the smaller basic amplifying unit arrays individually, and adjust and optimize the number of basic amplifying units that are on or off, or the bias voltages of the basic amplifying units that are operating regularly.

FIGS. 4, 5 and 6 show embodiments of the multimode PA with a two-stage, three-stage or four-stage circuit respectively. However, the multimode PA is not limited to the given number of stages. In fact, the amplifier circuit at each stage comprises one or more basic amplifying unit arrays shown in FIG. 2, and connects to the amplifier circuit of other stages in cascade, thus a multimode PA of any stage of amplifier circuit is possible. Therefore, the multimode PA is able to adapt to different requirements imposed by different telecommunication standards or power (gain) modes.

The multimode PA can be used in mobile terminals as an important component of the RF circuit. "Mobile terminals" herein refers to computing devices that can be used in a moving environment and supports a plurality of telecommunication standards, including EDGE, WCDMA, TD-SCDMA, and TD-LTE, such as mobile phones, laptops, tablets, or car computers. In addition, the multimode PA can also be applied to other places where multimode technology is involved, such as base stations accommodating different telecommunication standards.

The multimode PA, the method of switching among multiple modes thereof and the mobile terminals using the multimode PA provided by the present invention have been explained in detail. Under the premise of staying in line with the substantive spirit of the present invention, any obvious change done by any regular technician in this field constitutes an infringement to the patent of the present invention. The violators shall be held accountable to the corresponding legal responsibility.

What is claimed is:

1. A multimode power amplifier (PA), comprising two or more stages of amplifier circuits connected in cascade, wherein:
    each amplifier circuit comprises one or more basic amplifying unit array comprising a plurality of basic amplifying units connected in parallel;
    each basic amplifying unit comprises a capacitor, a amplifying transistor and a resistor, wherein the capacitor connects, at one end, the radio frequency (RF) signal input terminal, and at another end, a base of the amplifying transistor; the resistor connects, at one end, a bias voltage terminal, and at another end, the base of the amplifying transistor; a collector of the amplifying transistor connects a supply voltage terminal;
    an emitter of the amplifying transistor of each basic amplifying unit connects a reference voltage;
    a bias voltage of each basic amplifying unit array is controlled independently;
    an inductor is installed between the supply voltage terminal of the amplifier circuit of a previous stage and a RF signal input terminal of the amplifier circuit of a next stage; the supply voltage terminal of the amplifier circuit of the previous stage couples the RF signals to the RF signal input terminal of the amplifier circuit of the next stage.

2. A multimode PA comprising two or more stages of amplifier circuits connected in cascade, wherein an amplifier circuit at each stage comprises one or more basic amplifying unit array comprising a plurality of basic amplifying units connected in parallel;
    a basic amplifying unit comprises a capacitor, an amplifying transistor and a resistor, wherein the capacitor connects between a RF signal input terminal and a base of the amplifying transistor; the resistor connects between a bias voltage terminal and the base of the amplifying transistor; a collector of the amplifying transistor connects a supply voltage terminal;
    a bias voltage of each basic amplifying unit array is controlled independently.

3. The multimode PA of claim 2 wherein the supply voltage terminal of an amplifier circuit of the previous stage couples RF signals to the RF signal input terminal of an amplifier circuit at the next stage.

4. The multimode PA of claim 3 wherein an inductor is installed between the supply voltage terminal of the amplifier circuit of the previous stage and the RF signal input terminal of the amplifier circuit of the next stage.

5. The multimode PA of claim 2 wherein an emitter of the amplifying transistor of the basic amplifying unit connects to a reference voltage.

\* \* \* \* \*